US007653891B1

(12) United States Patent
Anderson et al.

(10) Patent No.: US 7,653,891 B1
(45) Date of Patent: Jan. 26, 2010

(54) METHOD OF REDUCING POWER OF A CIRCUIT

(75) Inventors: Jason H. Anderson, Toronto (CA);
Manoj Chirania, Palo Alto, CA (US);
Subodh Gupta, Belmont, CA (US);
Philip D. Costello, Saratoga, CA (US)

(73) Assignee: XILINX, Inc., San Jose, CA (US)

( * ) Notice: Subject to any disclaimer, the term of this patent is extended or adjusted under 35 U.S.C. 154(b) by 11 days.

(21) Appl. No.: 11/710,096

(22) Filed: Feb. 23, 2007

(51) Int. Cl.
*H03K 17/693* (2006.01)
(52) U.S. Cl. .......................................... 716/16; 326/41
(58) Field of Classification Search ............. 326/37–41, 326/47; 713/300, 320–324, 330, 340; 716/4, 716/12, 16
See application file for complete search history.

(56) References Cited

U.S. PATENT DOCUMENTS

| 6,992,505 | B1 * | 1/2006 | Zhou ............................ 326/41 |
| 6,993,737 | B1 | 1/2006 | Anderson et al. |
| 7,188,266 | B1 * | 3/2007 | Mendel et al. ............... 713/320 |

* cited by examiner

*Primary Examiner*—Vibol Tan
*Assistant Examiner*—Christopher Lo
(74) *Attorney, Agent, or Firm*—John J. King (57) ABSTRACT

A method of reducing power of a circuit is described. The method includes determining at least one unused selection input associated with stages of a multiplexer tree; pulling the at least one unused selection input to a constant value; and assigning predetermined values to unused data inputs of the multiplexer tree associated with the at least one unused selection input.

17 Claims, 6 Drawing Sheets

METHOD OF REDUCING POWER OF A CIRCUIT

FIELD OF THE INVENTION

The present invention relates generally to circuits, and in particular, to a method of reducing power of a circuit.

BACKGROUND OF THE INVENTION

Integrated circuits are an integral part of any electronic device. A variety of integrated circuits are often used together to enable the operation of the electronic device. While integrated circuits are typically designed for a particular application, one type of integrated circuit which enables flexibility is a programmable logic device (PLD). A PLD is designed to be user-programmable so that users may implement logic designs of their choices. One type of PLD is the Complex Programmable Logic Device (CPLD). A CPLD includes two or more "function blocks" having a two-level AND/OR structure connected together and to input/output (I/O) resources by an interconnect switch matrix. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources according to a routing configuration. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs typically exhibit greater static power consumption than dedicated logic devices such as application specific integrated circuits (ASICs). One reason for the PLD's high power consumption is because only a subset of the available resources of a PLD may be used for any given design, and the unused resources still consume static power. That is, while the unused resources are necessary for providing greater mapping flexibility to the PLD, these unused resources still consume static power in the form of leakage current. PLDs also have a significantly higher dynamic power consumption than standard ASICs having dedicated logic because of the hardware overhead required to make PLDs programmable by the end-user.

Accordingly, there is a need for reducing the power consumed by circuits such as programmable logic devices.

SUMMARY OF THE INVENTION

A method of reducing power of a circuit is described. The method comprises determining at least one unused selection input associated with stages of a multiplexer tree; pulling the at least one unused selection input to a constant value; and assigning predetermined values to unused data inputs of the multiplexer tree associated with the at least one unused selection input. Assigning predetermined values to unused data inputs of the multiplexer tree may comprise assigning a value to a data input of a multiplexer of the multiplexer tree to prevent toggling at the output of the multiplexer. The method may further comprise determining location of the at least one unused selection input of the multiplexer tree, wherein assigning predetermined values to unused data inputs of the multiplexer tree comprises assigning predetermined values based upon the location of the at least one unused selection input within the multiplexer tree.

According to an alternate embodiment, a method of reducing power of a circuit comprises determining the location of at least one unused selection input within a multiplexer tree; pulling the at least one unused selection input to a constant value; and assigning predetermined values to unused data inputs of the multiplexer tree based upon the location of the at least one unused selection input within the multiplexer tree.

According to another embodiment, a method of reducing power of a circuit implemented in lookup tables of a programmable logic device comprises receiving a routing configuration for the circuit; determining unused entries for the lookup tables; pulling selection signals associated with unused selection inputs of the lookup tables to a constant value, wherein the unused selection inputs correspond to the unused entries for the lookup tables; and assigning predetermined values to the unused entries for the lookup tables.

DETAILED DESCRIPTION OF THE DRAWINGS

The CLBs in FPGAs contain look-up tables (LUTs) for implementing logic functions. Conventional implementation software tools assume that some unused inputs to LUTs may be either 0 or 1 (i.e., a "don't care"). This assumption has certain important implications for power, and actually leads to higher static and dynamic power in some cases. Conventional PLDs, which consume a lot of power, may not be suitable for some low-power applications, such as portable devices, for example.

Figure 1:
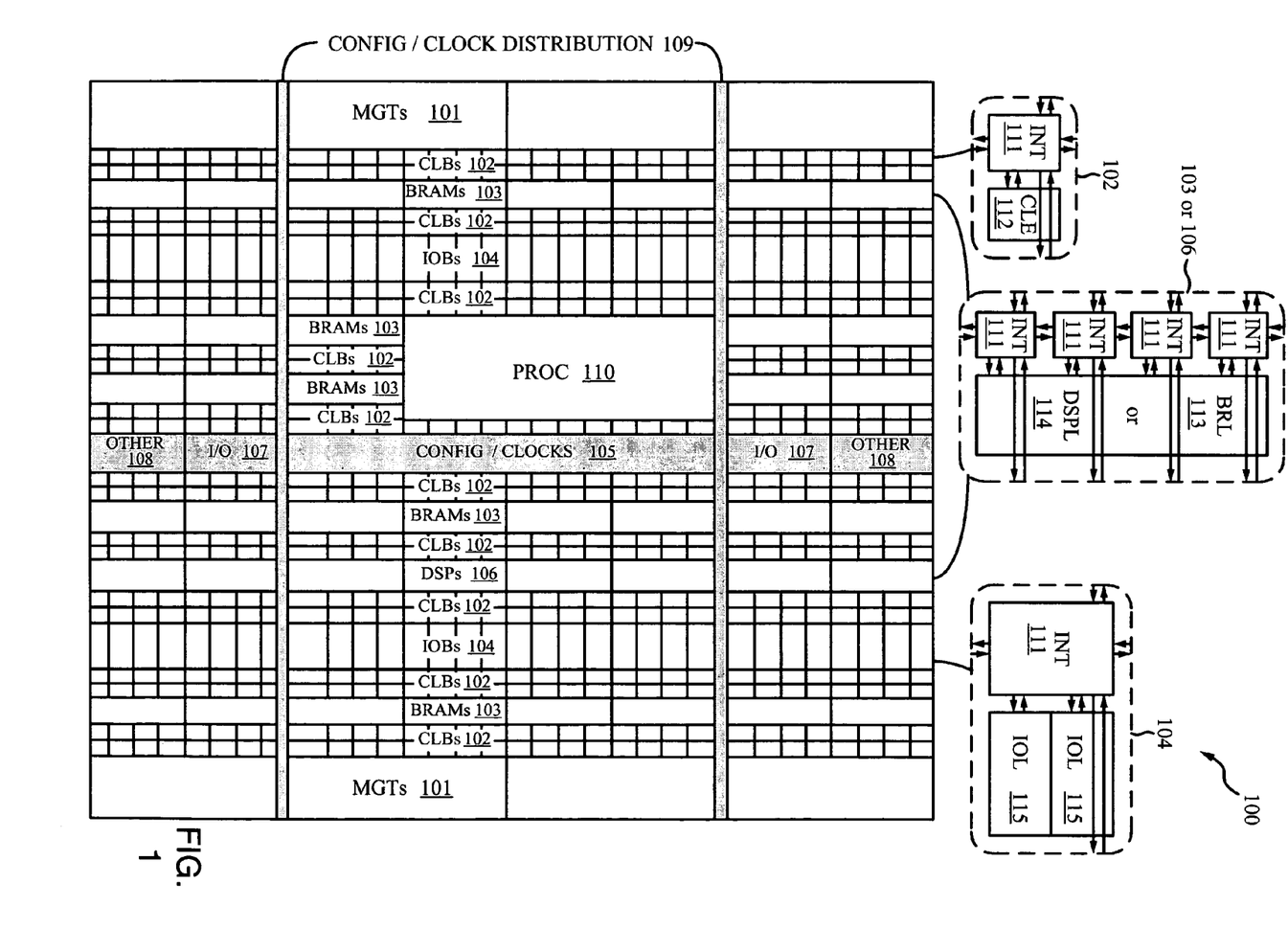
FIG. 1 is a block diagram of a programmable logic device comprising circuits having unused inputs according to an embodiment the present invention.

Turning first to FIG. 1, a block diagram of a field programmable gate array according to an embodiment of the present invention is shown. The FPGA architecture 100 of FIG. 1 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS. 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110). As will be described in more detail below, the configurable logic blocks may comprise circuits having unused inputs.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). As will be described in more detail below, the values stored in the lookup table may be stored in configuration memory elements, often called distributed RAM, which are inputs to a multiplexer tree. A BRAM 103 may include a BRAM logic element (BRL 113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111).

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 2:
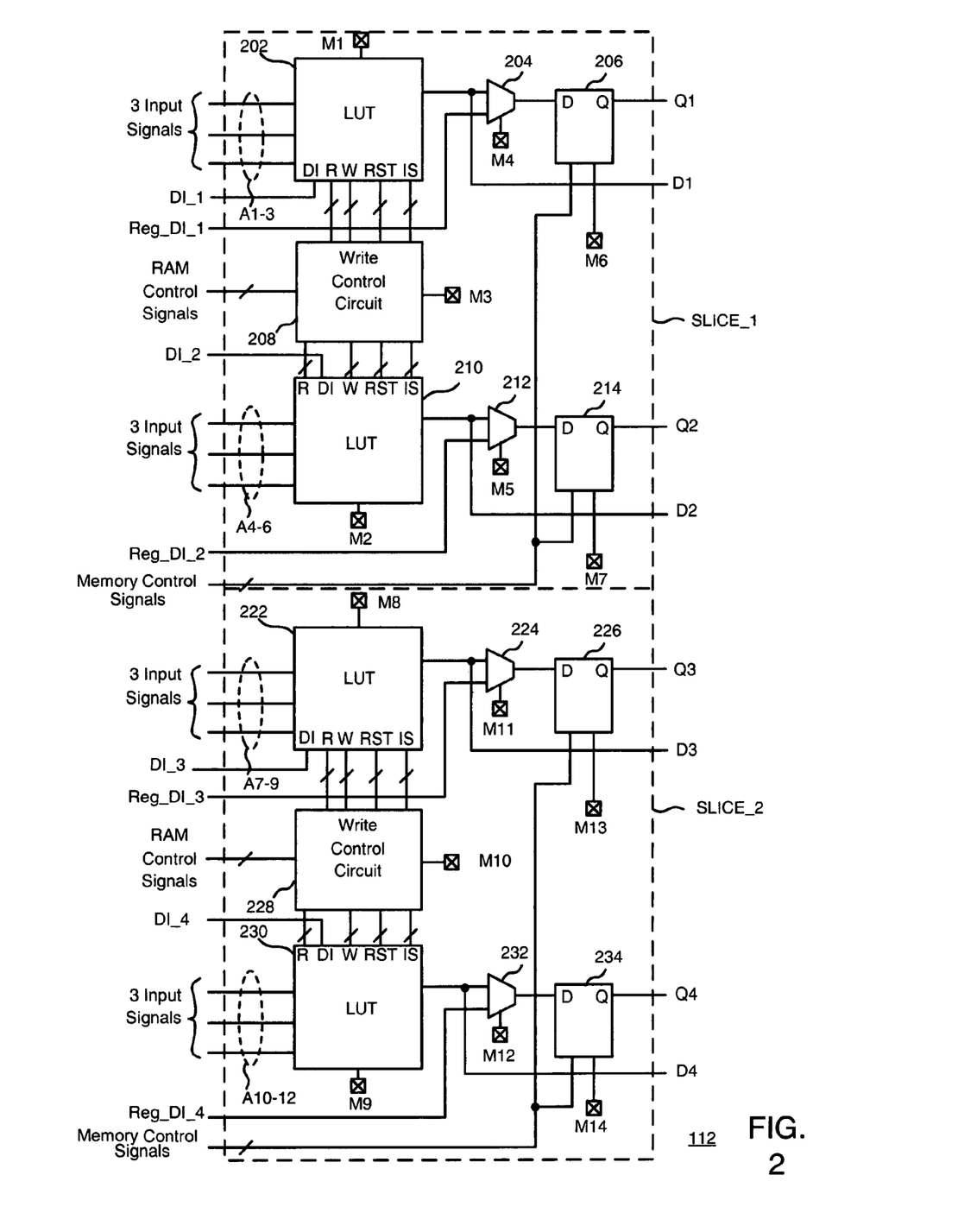
FIG. 2 is a block diagram of a configurable logic element of the programmable logic device of FIG. 1 according to an embodiment of the present invention.

Turning now to FIG. 2, a block diagram of a configurable logic element of the field programmable gate array of FIG. 1 according to an embodiment of the present invention is shown. In particular, FIG. 2 illustrates in simplified form a configurable logic element of a configuration logic block 102 of FIG. 1. The configurable logic element shown comprises two similar slices, labeled SLICE_1 and SLICE_2 in the figure, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table storing data in the entries of the lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table in the example of FIG. 2 has three input signals which will address one of eight memory elements of the LUT. The memory elements of the LUT are stored with data provided to the programmable logic device as a part of a configuration bitstream. Slice 1 comprises a function generator implemented as a LUT 202 coupled to a multiplexer 204. In particular, the LUT 202 receives 3 input signals A1-A3 which are decoded to generate an output D1 associated with data stored in the LUT at the address designated by the input signals. The multiplexer 204 is adapted to receive the output of LUT 202 and a registered value of Reg_DI_1. The output of the multiplexer 204 is coupled to a register 206 which generates an output Q1.

A Write Control Circuit 208 is coupled to receive RAM control signals and generate signals to control the LUT 202. In addition to a data input (DI) coupled to receive DI_1 and conventional read and write control signals coupled to a read enable input (R) and a write enable input (W), respectively, the LUT 202 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 210 coupled to a multiplexer 212. The LUT 210 is adapted to receive input signals A4-6, while the multiplexer 212 is coupled to receive the output D2 of the LUT 210 and the registered input value Reg_DI_2. The output of the multiplexer 212 is coupled to a register 214 which generates an output Q2. The write control circuit 208 also generates a partial reset signal and an initial state signal for selectively resetting or setting one or more of the bits of the LUT 210.

Similarly, slice 2 comprises a function generator implemented as a LUT 222 coupled to a multiplexer 224. The LUT 222 is adapted to receive input signals A7-9, while the multiplexer 224 is coupled to receive the output of the LUT 222 and a registered input value Reg_DI_3. The output of the multiplexer 224 is coupled to a register 226 which generates an output Q3. A Write Control Circuit 228 is coupled to receive RAM control signals and generate signals to control the LUT 222. In particular, input signals A7-A9 are decoded to generate an output D3 associated with data stored in the LUT at the address designated by the input signals. The LUT 222 comprises a partial reset input (RST) for receiving a partial reset signal, and an initial state input (IS) for receiving an initial state signal. Similarly, slice 2 comprises a function generator implemented as a LUT 230 coupled to a multiplexer 232. The LUT 230 is adapted to receive input signals A10-12, while the multiplexer 232 is coupled to receive the output D4 of the LUT 230 and a registered input value Reg_DI_4. The output of the multiplexer 232 is coupled to a register 234 which generates an output Q4. The write control circuit 228 also generates a partial reset signal and an initial state signal for selectively resetting or setting one or more of the bits of the LUT 230. As noted above, a LUT may be implemented as a multiplexer tree, where inputs to the LUT are used as the selection inputs to the multiplexers of the tree. For various implementations of LUTs, certain of the data inputs may be faster due to the circuits used or the particular layout. For example, the stages closer to the output of a multiplexer tree are generally faster. Although 3-input LUTs are used in the examples described herein for simplicity, in general a LUT may have any arbitrary number of inputs, such as 4, 5, 6, or 8.

Turning now to FIGS. 3-8, examples of the configuration of lookup tables, and namely the selection of both data inputs to a first level of multiplexers of a multiplexer tree (i.e., data stored in the configuration memory cells for the lookup tables) as well as the selection of selection inputs for a level of multiplexers when a selection input is unused. The lookup table of FIGS. 3-8 may be implemented as lookup tables of configurable logic blocks of a device having programmable logic according to the lookup tables of FIG. 2, for example. A routing program for a PLD, such as the Xilinx ISE software tool, available from Xilinx, Inc. of San Jose, Calif., generates a routing configuration for a circuit and assigns signals to LUT inputs, and generally aims to use the fastest LUT inputs for the connections in a design whenever possible. In many cases, however, the router cannot find a convenient path through the routing fabric to the fastest input, so A2 input may be left unused. Further, for non-timing-critical connections in a design, any LUT input may be used by the router. The LUT input pin assignment is known only after the routing is complete. Accordingly, various examples having different unused inputs will be described.

Figure 3:
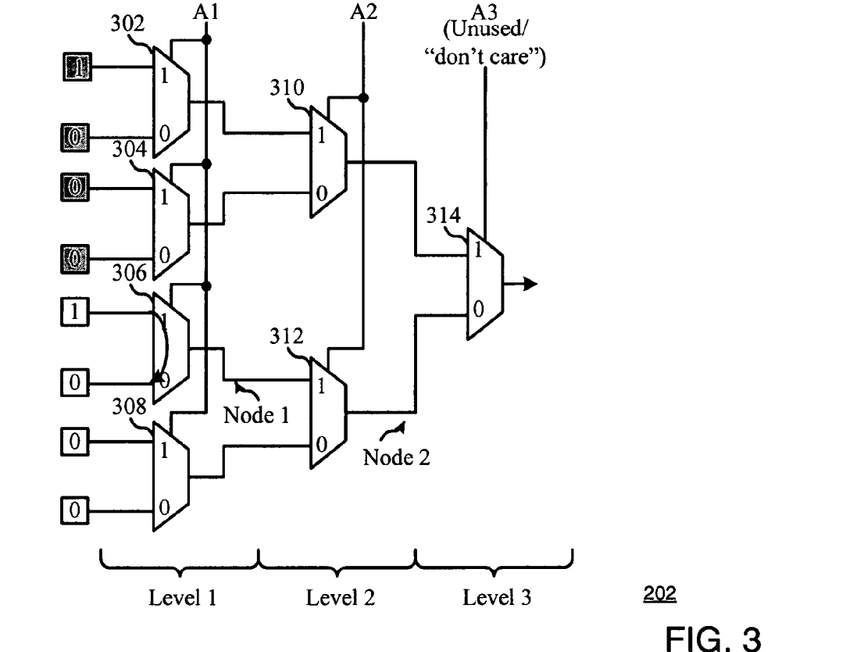
FIG. 3 is a multiplexer tree having an unused selection input at a third level multiplexer according to an embodiment of the present invention.

FIG. 3 particularly shows a multiplexer tree having an unused selection input at a third level multiplexer according to an embodiment of the present invention. As can be seen in the figure, the example multiplexer tree of FIG. 3 implements a 2-input AND function for input signals A1 and A2. The multiplexer tree of FIG. 3 comprises a plurality of multiplexers arranged in levels. A first level of multiplexers comprising multiplexers 302-308 are each coupled to receive inputs at a "0" data input and a "1" data input, and a signal A1 at a selection input, where the logical values of the signal applied to the selection input selects either the "0" input or the "1" data input to the multiplexer. The data inputs may comprise SRAM configuration cells, where the upper most SRAM configuration cell holds a logic "1" according to the embodiment of FIG. 3. A second level of multiplexers 310-312 comprises multiplexers which each receive the outputs of two first level multiplexers and receive a signal A2 at a selection input. Finally, a third level multiplexer 314 is coupled to receive the outputs of the second level multiplexers and receives a signal A3 at a selection input. As shown in FIG. 3, the selection signal A3 is unused (or a "don't care"). Accordingly to conventional implementations of circuits where portions of a circuit are unused, the selection signal may either be "1" or "0." Since the selection signal A3 may be either "1" or "0", the correct logic functionality for the lookup table can be ensured by setting the data inputs to first level multiplexers 306 and 308 to mirror the data inputs to multiplexers 302 and 304 (shown shaded). While the mirroring of data inputs to the multiplexer 306 and 308 ensures that the output of multiplexer 314 is the same for either a selection signal of "1" or "0" at the selection input of multiplexer 314, such an arrangement leads to greater static and dynamic power consumption. Consider now if unused selection input A3 is pulled high to a constant "1", then the "1" data input of the multiplexer 314 is selected, and the data inputs to first level multiplexers 306 and 308 are never selected and their content is never fed to the output of multiplexer 314. However, in FIG. 3, because the data inputs at multiplexer 306 are different, the output of multiplexer 306 at Node 1 will unnecessarily toggle with changes in the selection signal A1. This changing of the output at Node 1 may also cause the output of the multiplexer 312 at Node 2 to also change unnecessarily, leading to higher dynamic power consumption. The changes at Node 1 and Node 2 are unnecessary because such changes never propagate to the output of multiplexer 314, owing to select input A3 being pulled to "1". Further, leakage current in the multiplexer 306 may occur between the "1" data input and the "0" data input as shown by the arrow, leading to higher static power consumption.

Figure 4:
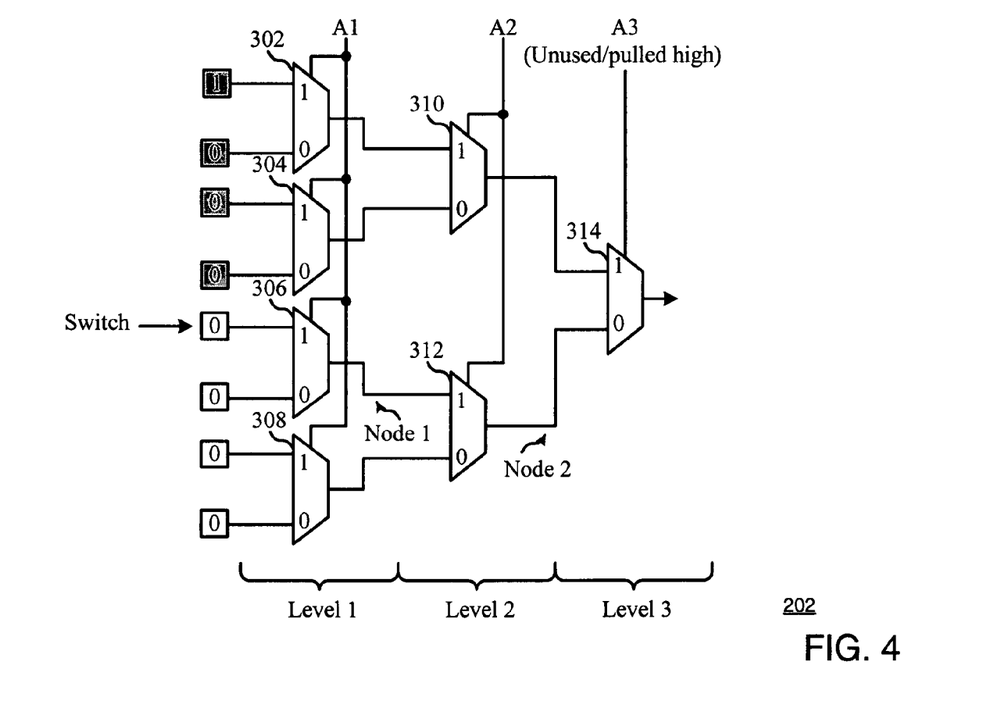
FIG. 4 is a multiplexer tree having an unused selection input at a third level multiplexer according to an alternate embodiment of the present invention.

Accordingly, rather than mirroring the data inputs to multiplexers 306 and 308 of the first level of multiplexers, the unused signal A3 at the selection input of multiplexer 314 is pulled to a logical "1" to select the "1" data input of the multiplexer 314. Accordingly, only the top portion of the multiplexer tree comprising multiplexers 302, 304 and 310 are used, where data inputs to multiplexers 302 and 304 may be selected. Further, all of the data inputs to the remaining multiplexers 306 and 308 of the first level of multiplexers are intentionally pulled to a low "0" input. That is, the value at the "1" data input of multiplexer 306 which was previously set to a logical "1" according to conventional techniques is switched to a logical "0." As a result, there is no switching at Node 1 or Node 2, and there is no leakage current in multiplexer 306. Accordingly, data inputs to first stage multiplexers which could not be selected as an output of the multiplexer tree are all pulled to a logical zero. In the example of FIGS. 3 and 4, this would be the data inputs to the multiplexers 306 and 308.

According to one embodiment of the invention, the hardware structure of FIG. 3 may comprise a 3-input LUT having seven 2-input multiplexers which are configured to a depth of 3. 8 SRAM configuration cells may be used to provide the data inputs to an 8-to-1 multiplexer tree. The LUT inputs are the select lines of the multiplexer. Here, A3 is the fast LUT input; while A1 is the slow LUT input. The SRAM cells hold the truth table of the logic function implemented by the LUT. Although a 3-input LUT is shown, a 6-input LUT would have the same tree structure, but would have 64 SRAM cells and a depth of 6 multiplexers. The optimization described above in FIG. 4 may comprise re-programming values of the configuration cells of the LUTs (i.e., inputs to the multiplexer tree) after the routing step of the computer-aided design (CAD) tool flow, with the assumption that unused LUT selection inputs are pulled high to logic "1." That is, the unused LUT inputs are detected at the post-routing stage, and the bottom-half of the LUT memory contents are re-programmed to be logic "0." The optimization can be applied when a contiguous set of the "deepest" (fastest) LUT inputs are not used. When the fastest LUT input is unused in a 6-LUT, the bottom-most 32 SRAM cells can be set to logic "0." When both the fastest and the second fastest LUT inputs are unused, 48 SRAM cells can be set to logic "0," and so on. Although the selection input of FIG. 4 is shown pulled to a constant logical level "1" by way of example, the unused input may be pulled to a constant logical level "0" where the lower half of the multiplexer tree could be used rather than the upper half. Similarly, although data inputs to the associated multiplexers are described as being switched to a logical "0", by way of example the data inputs may all be switched to a logical "1," for example if the circuits have lower static power when inputs are a logic "1" state. The optimization of FIG. 4 has been shown, based on board-level power measurements, to reduce dynamic power drawn from the internal power supply by several percent in some circuits. It should be noted that this optimization has no impact on logic functionality or timing performance, and therefore is a power reduction technique which has no associated cost to implement.

Figure 5:
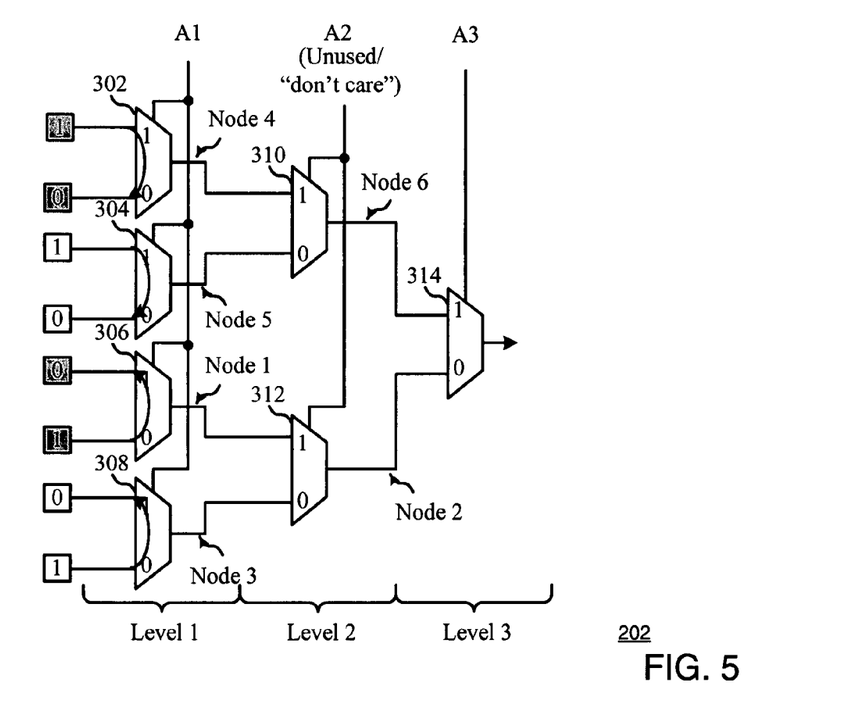
FIG. 5 is a multiplexer tree having an unused selection input at a second level multiplexer according to an embodiment of the present invention.
Figure 6:
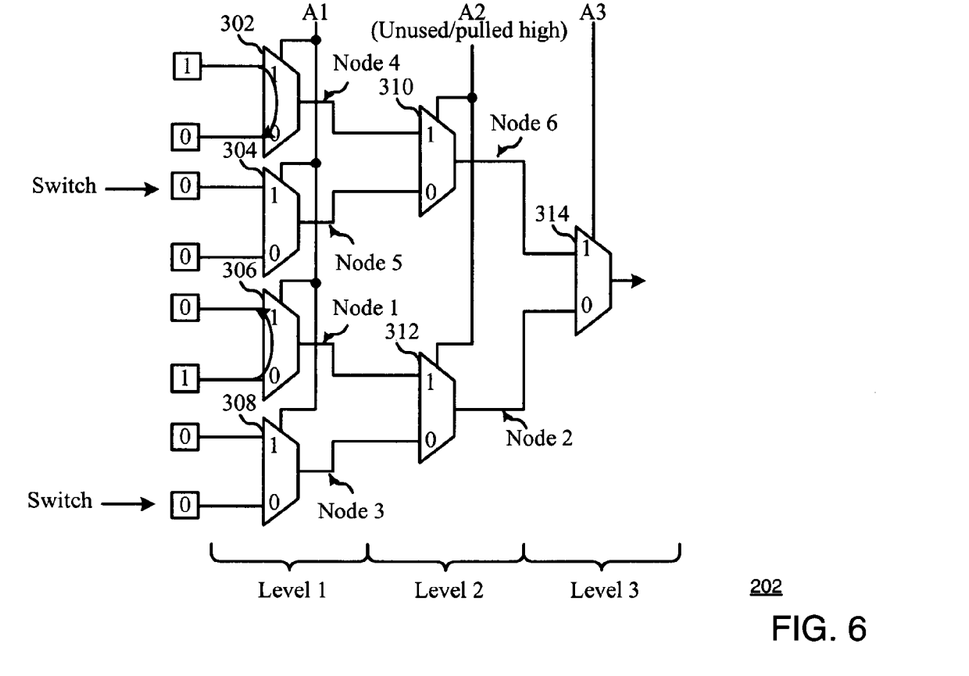
FIG. 6 is a multiplexer tree having an unused selection input at a second level multiplexer according to an alternate embodiment of the present invention.

As shown in FIG. 5, a multiplexer tree having an unused selection input at a second level of multiplexers is shown. If A2 were unused in the 3-input LUT of FIG. 5, the third and fourth SRAM cells and the seventh and eight SRAM cells could be set to logic "0" as shown for example in FIG. 6. In particular, after pulling the selection input A2 high, changing the data input "1" of the multiplexer 304 from a logical "1" to a logical "0" will not only eliminate toggling on Node 5, but will also eliminate leakage current in the multiplexer 304. Similarly, changing the data input "0" of the multiplexer 308 from a logical "1" to a logical "0" will also eliminate toggling on Node 3 and leakage current in the multiplexer 304. Accordingly, inputs to the first stage of multiplexers which could not be selected by a later multiplexer as an output of the multiplexer tree are all pulled to a logical zero. In the example of FIGS. 5 and 6, this would be the inputs to the multiplexers 304 and 308.

Figure 7:
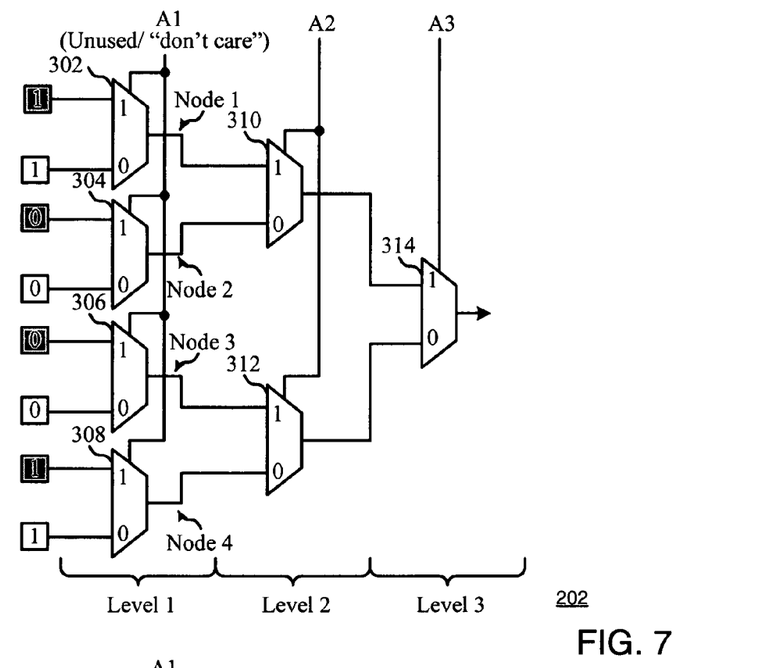
FIG. 7 is a multiplexer tree having an unused selection input at a first level multiplexer according to an embodiment of the present invention.
Figure 8:
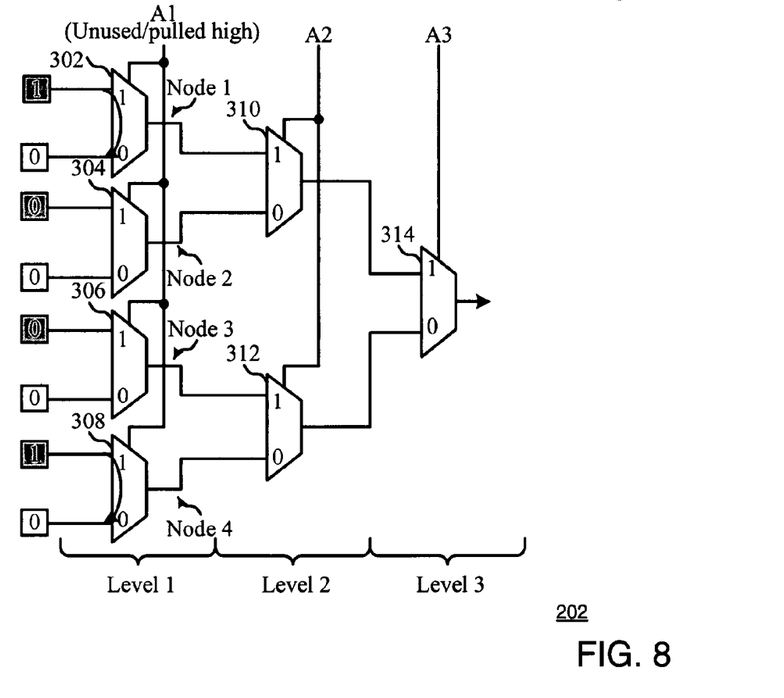
FIG. 8 is a multiplexer tree having an unused selection input at a first level multiplexer according to an alternate embodiment of the present invention.

Turning now to FIG. 7, a multiplexer tree having an unused selection input at a first level multiplexer according to an embodiment of the present invention is shown. However, no dynamic power is saved by applying the optimization as described above in reference to FIGS. 3-6. Thus, in order to apply the optimizations as described above, the multiplexer tree must have at least one "used" selection input in a multiplexer earlier than the multiplexer having an unused selection input. In the case where input A1 is unused and inputs A2 and A3 are used, matching the unused data inputs of the multiplexers to the valid inputs, for example by providing a logical "1" to the "0" data input of the multiplexer 302 to match the logical "1" at the "1" data input, eliminates leakage current. Because the A1 selection signal is not used, there is no loss of power due to unnecessary toggling at the outputs of the first level of multiplexers. Rather, leakage power may be increased if the data inputs at the first stage are not matched after the selection input A1 is pulled high, as shown in FIG. 8. Accordingly, if the unused selection input is the selection input for the first stage of multiplexers, the value of the selection input may be a "don't care" value. However, the inputs of the two input multiplexers are matched to avoid leakage current.

Figure 9:
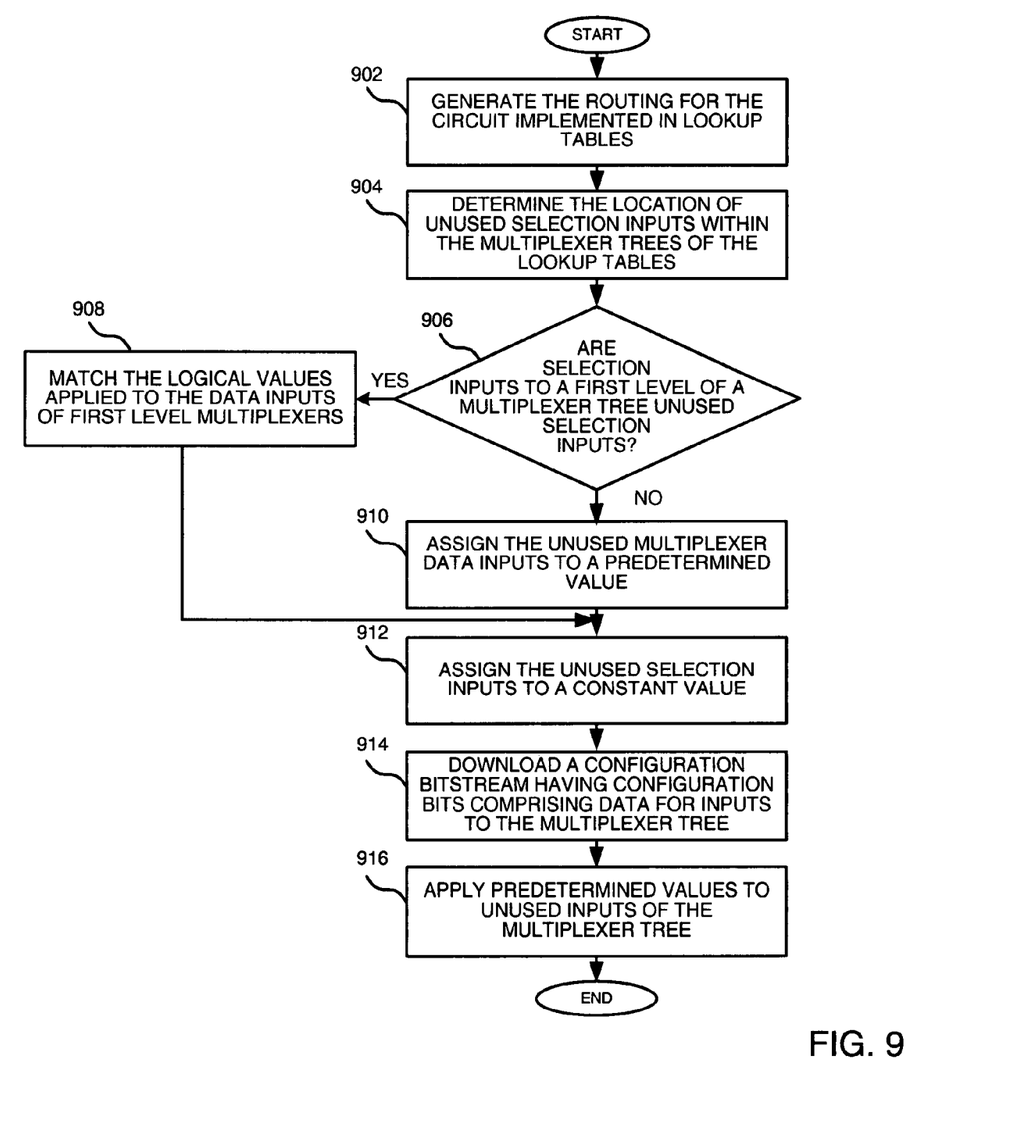
FIG. 9 is a flow chart showing a method of assigning values to unused inputs of a circuit according to an embodiment the present invention.

Finally, turning now to FIG. 9, a flow chart shows a method of assigning values to unused inputs of a circuit according to an embodiment the present invention. In particular, the routing for the circuit implemented in lookup tables is generated at a step 902. The locations of unused selection inputs associated with stages within the multiplexer trees of the lookup table are determined at a step 904. It is then determined whether the selection inputs to a first level of a multiplexer tree comprises unused selection inputs at a step 906. If so, the data inputs of a first level of multiplexers of the multiplexer are matched at a step 908 when the first level of multiplexers of the multiplexer tree comprises unused multiplexers. Otherwise, a predetermined value is assigned to unused data inputs of the multiplexer tree associated with the unused selection inputs in step 910. The unused selection inputs are assigned to a constant value in step 912. A configuration bitstream having configuration bits comprising data for data inputs to the multiplexer trees is downloaded at a step 914. Predetermined values are then applied to unused data inputs of the multiplexer tree at a step 916. Accordingly, the method of FIG. 9 reduces the static and dynamic power consumption of the lookup table of a device having programmable logic. The method of FIG. 9 may be implemented using any of the circuits of FIGS. 1-8 as described, or any other suitable circuits.

It can therefore be appreciated that the new and novel method of assigning values to unused inputs of a circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of reducing dynamic power of a circuit, the method comprising:
    receiving a routing configuration assigning selection inputs for multiplexers of the circuit;
    determining at least one unused selection input associated with a stage of a plurality of stages of a multiplexer tree used by the circuit based upon the routing configuration for the circuit, wherein each stage of the plurality of stages beyond a first stage receives an output of a previous stage;
    pulling the at least one unused selection input to a constant value for selecting at least one predetermined input coupled to the stage of the multiplexer tree receiving the at least one unused selection input;
    assigning predetermined values to unused data inputs of the multiplexer tree associated with the at least one unused selection input, wherein the assigned predetermined values for unused data inputs are selected to reduce toggling in adjacent stages including an internal stage receiving outputs from a previous stage, wherein the adjacent stages receive selection inputs used for selecting different inputs coupled to the adjacent stages; and
    minimizing dynamic power in the circuit implementing the multiplexer tree based upon the received routing configuration and the assigned predetermined values for the unused data inputs.

2. The method of claim 1 further comprising determining a location of the at least one unused selection input of the multiplexer tree,
    wherein assigning predetermined values to unused data inputs of the multiplexer tree comprises assigning predetermined values based upon the location of the at least one unused selection input within the multiplexer tree.

3. The method of claim 1 wherein assigning predetermined values to unused data inputs of the multiplexer tree comprises assigning values to data inputs of two-input multiplexers.

4. The method of claim 3 further comprising matching data inputs of a first level of multiplexers of the multiplexer tree when the first level of multiplexers of the multiplexer tree comprises multiplexers having an unused selection input.

5. The method of claim 1 wherein assigning predetermined values to unused data inputs of the multiplexer tree comprises assigning values to memory elements of a lookup table.

6. The method of claim 5 wherein assigning values to memory elements of a lookup table comprises downloading configuration bits for a device having programmable logic.

7. A method of reducing dynamic power of a circuit, the method comprising:

receiving a routing configuration assigning selection inputs for multiplexers of the circuit;

determining a location of at least one unused selection input associated with a stage of a plurality of stages within a multiplexer tree used by the circuit based upon the routing configuration for the circuit, wherein each stage of the plurality of stages beyond a first stage receives an output of a previous stage;

pulling the at least one unused selection input to a constant value for selecting at least one predetermined input coupled to the stage of the multiplexer tree receiving the at least one unused selection input;

assigning predetermined values to unused data inputs of the multiplexer tree based upon the location of the at least one unused selection input within the multiplexer tree, wherein the assigned predetermined values for unused data inputs are selected to reduce toggling in adjacent stages including an internal stage receiving outputs from a previous stage, wherein the adjacent stages receive selection inputs used for selecting different inputs coupled to the adjacent stages; and minimizing dynamic power in the circuit implementing the multiplexer tree based upon the received routing configuration and the assigned predetermined values for the unused data inputs.

8. The method of claim 7 wherein assigning predetermined values to unused data inputs comprises assigning values to data inputs of two-input multiplexers.

9. The method of claim 8 further comprising determining whether selection inputs for a first level of multiplexers of the multiplexer tree comprise unused selection inputs.

10. The method of claim 9 further comprising matching data inputs of the first level of multiplexers of the multiplexer tree when the selection inputs for the first level of multiplexers of the multiplexer tree comprise unused selection inputs.

11. The method of claim 7 wherein assigning predetermined values to unused data inputs of the multiplexer tree comprises assigning values to memory elements of a lookup table.

12. The method of claim 11 wherein assigning predetermined values to unused data inputs of the multiplexer tree comprises downloading a configuration bitstream having configuration bits comprising the values assigned to memory elements of the lookup table.

13. A method of reducing dynamic power of a circuit implemented in lookup tables of a programmable device, the method comprising:

receiving a routing configuration for the circuit;

receiving input pin assignments for selection inputs of the lookup tables, wherein the lookup tables comprise multiplexer trees having a plurality of stages, wherein each stage of the plurality of stages beyond a first stage of a multiplexer tree receives an output of a previous stage of the multiplexer tree;

determining unused entries for the lookup tables;

pulling selection signals associated with unused selection inputs of the lookup tables to a constant value for selecting predetermined entries of the lookup tables, wherein the unused selection inputs correspond to the unused entries for the lookup tables;

assigning predetermined values to the unused entries for the lookup tables, wherein the assigned predetermined values for the unused entries are selected to reduce toggling in adjacent stages of a multiplexer tree including an internal stage receiving outputs from a previous stage, wherein the adjacent stages receive selection signals used for selecting different inputs coupled to the internal stages; and minimizing dynamic power in the circuit based upon the received routing configuration and the assigned predetermined values for the unused entries of the lookup tables.

14. The method of claim 13 further comprising generating the routing configuration for the circuit.

15. The method of claim 13 wherein assigning predetermined values to unused entries for the lookup table comprises assigning values to data inputs of two-input multiplexers.

16. The method of claim 15 further comprising matching data inputs of a first level of multiplexers of a lookup table of the lookup tables when selection inputs for the first level of multiplexers comprise unused selection inputs.

17. The method of claim 13 further comprising downloading a configuration bitstream having configuration bits comprising data for the lookup tables.

* * * * *